United States Patent
Nakamura

(10) Patent No.: US 9,917,415 B2
(45) Date of Patent: Mar. 13, 2018

(54) DRIVING CIRCUIT FOR LIGHT EMITTING ELEMENT

(71) Applicant: CANON KABUSHIKI KAISHA, Tokyo (JP)

(72) Inventor: Hiroyuki Nakamura, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 12 days.

(21) Appl. No.: 15/040,997

(22) Filed: Feb. 10, 2016

(65) Prior Publication Data

US 2016/0164253 A1  Jun. 9, 2016

Related U.S. Application Data

(63) Continuation of application No. 13/450,393, filed on Apr. 18, 2012, now abandoned.

(30) Foreign Application Priority Data

Apr. 27, 2011 (JP) ................. 2011-100131

(51) Int. Cl.
   - H01S 5/042 (2006.01)
   - H01S 5/0683 (2006.01)
   - H05B 33/08 (2006.01)
   - H01S 5/068 (2006.01)
   - B41J 2/435 (2006.01)
   - G03G 15/04 (2006.01)

(52) U.S. Cl.
   CPC ........ *H01S 5/0427* (2013.01); *H01S 5/06808* (2013.01); *H01S 5/06832* (2013.01); *H05B 33/0818* (2013.01); *B41J 2/435* (2013.01); *G03G 15/04054* (2013.01)

(58) Field of Classification Search
   CPC .... H01S 5/06808; H01S 5/06832; H01S 3/00; B41J 2/435; G03G 15/04054
   See application file for complete search history.

(56) References Cited

U.S. PATENT DOCUMENTS

| 5,006,732 | A | 4/1991 | Nakamura |
| 5,349,595 | A | 9/1994 | Ogawa et al. |
| 6,272,160 | B1 * | 8/2001 | Stronczer ............. H01S 5/0427 372/38.02 |
| 6,560,258 | B1 * | 5/2003 | McQuilkin ............ H01S 5/042 372/26 |
| 6,618,406 | B1 * | 9/2003 | Kaminishi ............. H01S 5/042 372/38.02 |
| 6,670,773 | B2 | 12/2003 | Nakamura et al. |

(Continued)

FOREIGN PATENT DOCUMENTS

JP  05-243654 A  9/1993

*Primary Examiner* — Tuan Nguyen
(74) *Attorney, Agent, or Firm* — Fitzpatrick, Cella, Harper & Scinto

(57) ABSTRACT

A driving circuit for causing a light emitting element to emit light in response to a driving signal is provided. The driving circuit comprising a first current supply circuit that starts to supply a driving current to the light emitting element in response to the driving signal, a second current supply circuit that starts to supply a supplementary current to the light emitting element in response to the driving signal. The second current supply circuit stops to supply the supplementary current upon detecting that a voltage applied to the light emitting element has reached a threshold voltage.

20 Claims, 7 Drawing Sheets

(56) References Cited

U.S. PATENT DOCUMENTS

| | | |
|---|---|---|
| 6,870,553 B2 | 3/2005 | Kondo et al. |
| 6,992,663 B2 | 1/2006 | Nakamura et al. |
| 7,573,302 B2 | 8/2009 | Nakamura |
| 7,902,906 B2 | 3/2011 | Nakamura |
| 2002/0003821 A1* | 1/2002 | Dietrich ............... H01S 5/0683 372/38.01 |
| 2002/0085599 A1* | 7/2002 | Schrodinger ........... H01S 5/042 372/38.02 |
| 2003/0086456 A1* | 5/2003 | Tatehara ................ H01S 5/042 372/38.02 |
| 2004/0174916 A1* | 9/2004 | Chujo .................... H04B 10/58 372/38.02 |
| 2006/0170636 A1* | 8/2006 | Nakamura ........... G09G 3/3233 345/92 |
| 2006/0291786 A1 | 12/2006 | Kiely et al. |
| 2008/0169771 A1* | 7/2008 | Nakamura ............. H01S 5/042 315/291 |
| 2010/0033517 A1 | 2/2010 | Ho et al. |
| 2010/0315019 A1 | 12/2010 | Hoogzaad et al. |

\* cited by examiner

DRIVING CIRCUIT FOR LIGHT EMITTING ELEMENT

This application is a continuation of U.S. application Ser. No. 13/450,393, filed Apr. 18, 2012 (pending), the contents of which are incorporated herein by reference.

BACKGROUND OF THE INVENTION

Field of the Invention

The present invention relates to a driving circuit for a light emitting element.

Description of the Related Art

Light emitting elements emit light due to a driving current that is supplied to them from a driving circuit. In laser diodes, which are an example of light emitting elements, light emission starts after a junction capacitance is charged with the driving current, and the desired light emission state is sustained by the driving current. Japanese Patent Laid-Open No. 5-243654 proposes a technique of supplying a preliminary current in advance to the laser diode, in order to shorten the time after the driving current is supplied until the laser diode starts to emit light (referred to as "rise time" below). The junction capacitance of the laser diode is charged by this preliminary current, so that the rise time of the laser diode is shortened.

SUMMARY OF THE INVENTION

With the technique described in Japanese Patent Laid-Open No. 5-243654, the junction capacitance of the laser diode is charged by the driving current for sustaining the light emitting state of the laser diode. Therefore, even if the laser diode is charged in advance by a preliminary current, the rise time of the laser diode will be long. This is particularly evident if the current value of the driving current is low. Accordingly, in one aspect of the invention, a technique is proposed for shortening the rise time of the light emitting element.

An aspect of the present invention provides a driving circuit for causing a light emitting element to emit light in response to a driving signal, the driving circuit comprising: a first current supply circuit that starts to supply a driving current to the light emitting element in response to the driving signal; a second current supply circuit that starts to supply a supplementary current to the light emitting element in response to the driving signal; wherein the second current supply circuit stops to supply the supplementary current upon detecting that a voltage applied to the light emitting element has reached a threshold voltage.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Figure 1:
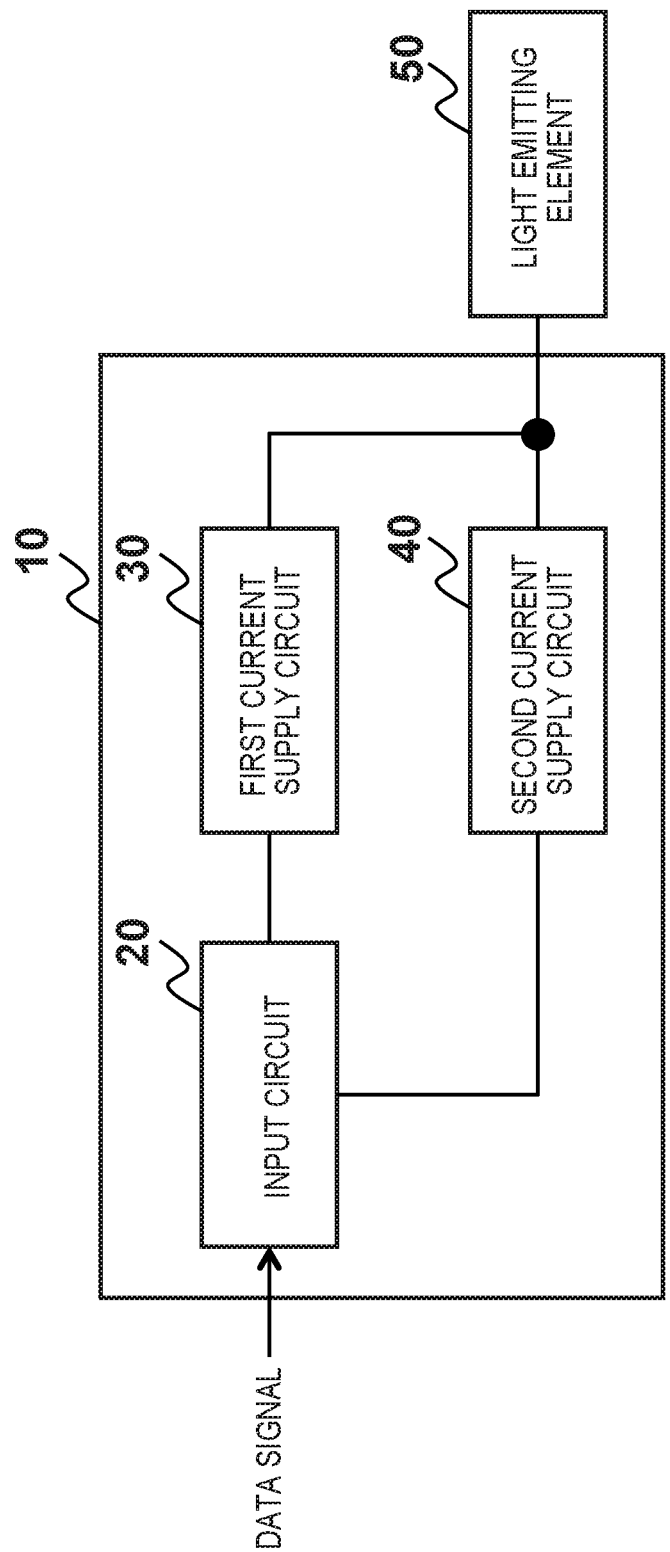
FIG. 1 is a diagram illustrating the functional configuration of an exemplary driving circuit of the present invention.

In the following, embodiments of the present invention are described in detail with reference to the accompanying drawings. A driving circuit according to one embodiment of the invention turns on a light emitting element in response to a driving signal that is input into it. The driving circuit and the light emitting element may be included in a copier, a laser beam printer (LBP) or the like. First, the functional configuration of an exemplary driving circuit 10 according to one embodiment of the invention is described with reference to FIG. 1. The driving circuit 10 may include an input circuit 20, a first current supply circuit 30 and a second current supply circuit 40. The driving circuit 10 is connected to a light emitting element 50 and turns the light emitting element 50 on/off.

The input circuit 20 obtains a data signal from outside the driving circuit 10, and controls the first current supply circuit 30 and the second current supply circuit 40 in response to this data signal. The first current supply circuit 30 supplies a driving current to the light emitting element 50. The light emitting element 50 transitions from the off state to the on state due to this driving current, and as long as the driving current is supplied to it, it stays in the on state. The second current supply circuit 40 supplies a supplementary current to the light emitting element 50. Due to this supplementary current, the rise time of the light emitting element 50 is shortened. When the second current supply circuit 40 detects that the voltage applied to the light emitting element 50 has reached a threshold voltage, it stops the supply of the supplementary current.

With the above-described embodiment, a supplementary current is supplied to the light emitting element 50 during the rise of the light emitting element 50, in addition to the driving current for sustaining the on state of the light emitting element 50. Due to this supply of the supplementary current, the rise time of the light emitting element 50 can be shortened. Moreover, in laser diodes, the value of the driving current depends on the light amount that is emitted. Furthermore, in laser diodes, the value of the driving current that is necessary in order to emit the same amount of light changes due to aging. The rise time of the laser diode becomes longer when the value of the driving current is low than when the value of the driving current is high. Consequently, if the light emitting element 50 is charged only with the driving current, then there is a variation in the rise time of the light emitting element 50 depending on the size of the driving current. With the present embodiment, since a supplementary current is supplied to the light emitting element 50 during the period of transitioning from the off state to the one state, it is possible to reduce variations in the rise time of the light emitting element 50 that are caused by variations in the current value of the driving current. That is to say, the driving circuit 10 is able to supply to the light emitting element 50 a uniform constant current pulse whose pulse width does not depend on the driving current. In the following, a specific circuit configuration realizing the functional configuration of the driving circuit 10 shown in FIG. 1 is explained.

A circuit configuration according to a first example of the driving circuit 10 is explained with reference to FIG. 2. The input circuit 20 may include an input terminal IN and inverters INV1 and INV2. The input terminal IN receives the input of a data signal from outside the driving circuit 10. The data signal is a signal that has been converted from a differential signal such as a LVDS (Low Voltage Differential Signaling) signal into a single-ended output, and is provided for example by a CPU of a copier or the like. The input terminal IN is connected to the input terminal of the inverter INV1. The output terminal of the inverter INV1 is connected to the input terminal of the inverter INV2.

The first current supply circuit 30 may include four PMOS transistors M1 to M4. The source (first main electrode) of the PMOS transistor M1 (first MOS transistor) is connected to a constant voltage source VDD. The drain (second main electrode) of the PMOS transistor M1 is connected via a constant current source ILD to ground GND. The drain of the PMOS transistor M1 and the gate of the PMOS transistor M1 are short-circuited. The source of the PMOS transistor M2 (second MOS transistor) is connected to the constant voltage source VDD. The drain of the PMOS transistor M2 is connected to the anode of a laser diode LD. The drain of the PMOS transistor M3 is connected to the gate and the drain of the PMOS transistor M1. The source of the PMOS transistor M3 is connected to the gate of the PMOS transistor M2. Consequently, if the PMOS transistor M3 is on, the PMOS transistors M1 and M2 constitute a current mirror circuit that supplies to the anode of the laser diode LD a current that depends on the current supplied from the constant current source ILD. The gate of the PMOS transistor M3 is connected to the output terminal of the inverter INV1. The drain of the PMOS transistor M4 is connected to the gate of the PMOS transistor M2. The source of the PMOS transistor M4 is connected to the constant voltage source VDD. The gate of the PMOS transistor M4 is connected to the output terminal of the inverter INV2.

The second current supply circuit 40 may include an NMOS transistor M5, an inverter INV3 and three diodes D1 to D3. The input terminal of the inverter INV3 is connected to the output terminal of the inverter INV1, and the output terminal of the inverter INV3 is connected to the gate of the NMOS transistor M5. The drain of the NMOS transistor M5 is connected to the constant voltage source VDD. The source of the NMOS transistor M5 is connected to the anode of the laser diode LD. The three diodes D1 to D3 are connected in series. The anode of the diode D1 is connected to the gate of the NMOS transistor M5, and the cathode of the diode D3 is connected to ground GND. The light emitting element 50 may include a laser diode LD and its parasitic capacitance $C_{LD}$. The cathode of the laser diode LD is connected to ground GND.

Figure 3:
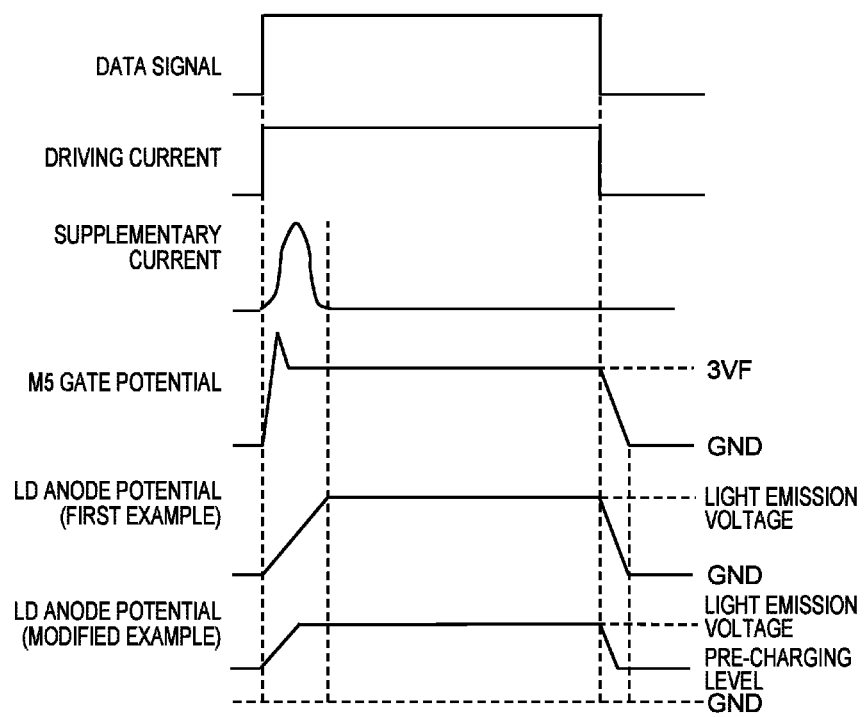
FIG. 3 is a diagram illustrating the operation of the driving circuit according to the first example of the present invention.

Next, the operation of the driving circuit 10 according to the first example is explained with reference to FIG. 3. In this example, the driving circuit 10 turns on the light emitting element 50 when the data signal is high-level (referred to as "H level" below) and turns off the light emitting element 50 when the data signal is low-level (referred to as "L level" below). That is to say, a data signal that is H level serves as the driving signal for causing the light emitting element 50 to emit light.

First of all, the operation of the driving circuit 10 is explained for the case that the data signal changes to H level, that is, that the light emitting element 50 is turned on. When the input terminal IN goes to H level, then the potential of the gate of the PMOS transistor M3 goes to L level, and the PMOS transistor M3 is turned on. At the same time, the potential of the gate of the PMOS transistor M4 goes to H level, and the PMOS transistor M4 is turned off. Thus, the current mirror circuit included in the first current supply circuit 30 takes on the driving state, and the first current supply circuit 30 starts to supply to the anode of the laser diode LD a driving current that is proportional to the current that is supplied from the constant current source ILD.

Moreover, since the output of the inverter INV3 goes to H level, the potential of the gate of the NMOS transistor M5 momentarily goes to H level, and is fixed (clamped) to 3 VF by the three diodes D1 to D3 that are connected in series behind the output of the inverter INV3. Here, VF is the respective forward voltage of the diodes D1 to D3. The potential of the source of the NMOS transistor M5 is equal to the potential of the anode electrode of the laser diode LD, and immediately after the data signal has changed to H level, it is approximately at ground potential. For this reason, the NMOS transistor M5 starts to operate as a source follower, and the NMOS transistor M5 starts to supply the supplementary current to the anode of the laser diode LD. When the potential of the anode of the laser diode LD increases and the voltage applied to the laser diode LD reaches the threshold voltage, then the gate-source voltage of the NMOS transistor M5 drops to its operation threshold voltage or less, and the NMOS transistor M5 stops to operate as a source follower. Thus, the second current supply circuit 40 stops to supply the supplementary current to the light emitting element 50.

As explained above, in the first example, the NMOS transistor M5 and the diodes D1 to D3 function as a detection circuit that detects that the voltage applied to the laser diode LD has reached the threshold voltage. If the threshold voltage used for this detection is the same as the light emission voltage of the laser diode LD, then the second current supply circuit 40 stops the supply of the supplementary current when the laser diode LD starts to emit light. Consequently, while the laser diode LD emits light, the driving current is supplied from the first current supply circuit 30, but no supplementary current is supplied from the second current supply circuit 40, so that the desired light-emitting state corresponding to the driving current is sustained. Moreover, the threshold voltage that is used for the detection may be lower than the light emission voltage of the laser diode LD. Also in this case, a supplementary current is supplied while the laser diode LD is not yet in the light emitting state, so that the rise time of the light emitting element 50 is shortened.

The following is an explanation of the operation of the driving circuit 10 for the case that the data signal changes to the L level, that is, the light emitting element 50 is turned off. When the input terminal IN goes to L level, the potential of the gate of the PMOS transistor M3 goes to H level, and the PMOS transistor M3 is turned off. At the same time, the potential of the gate of the PMOS transistor M4 goes to L level, and the PMOS transistor M4 is turned on. Thus, the current mirror circuit included in the first current supply circuit 30 is turned off, and the supply of driving current from the first current supply circuit 30 to the light emitting element 50 is stopped. Moreover, the potential of the gate of the NMOS transistor M5 goes to L level, and the second current supply circuit 40 sustains the state where the supply of the supplementary current to the light emitting element 50 is stopped.

Figure 4:
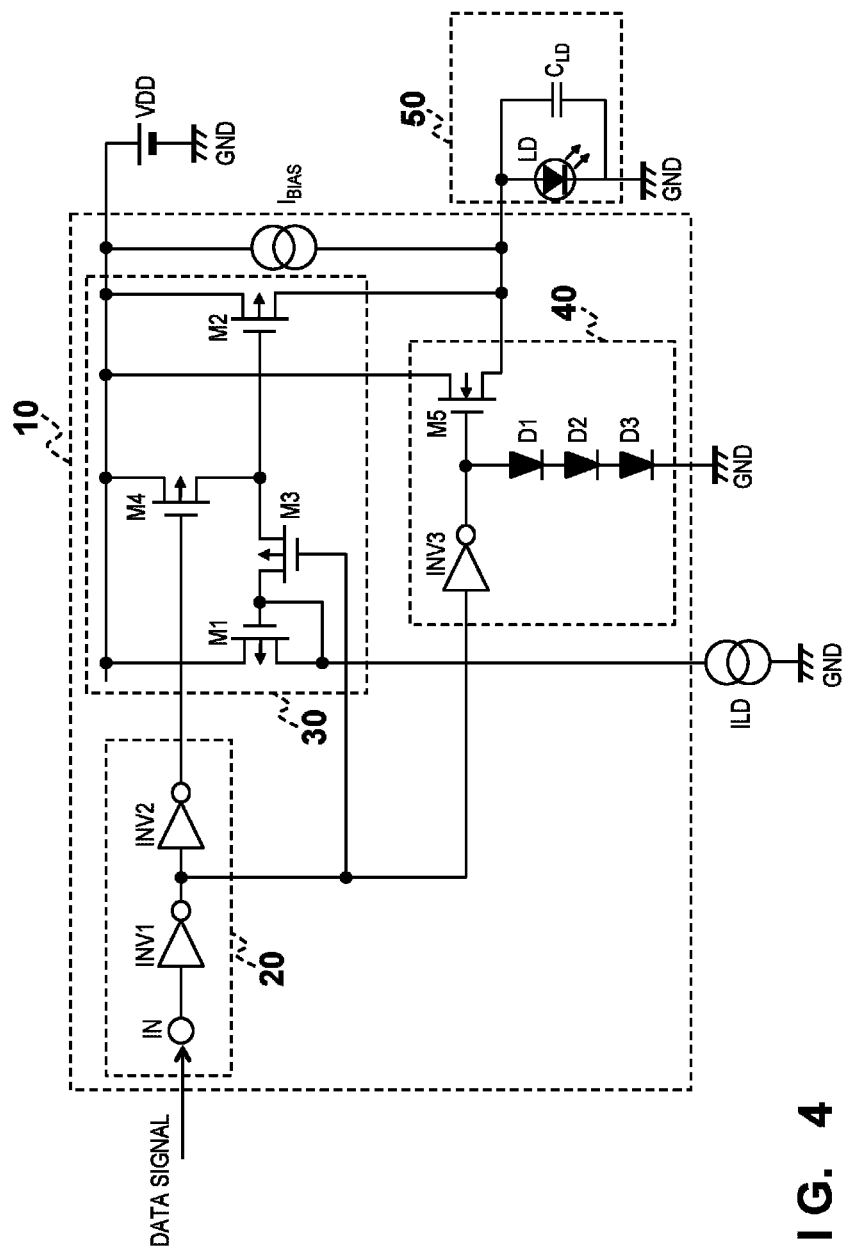
FIG. 4 is a diagram illustrating the circuit configuration of a driving circuit according to a modified example of the first example of the present invention.

Referring to FIG. 4, the following is an explanation of a circuit configuration according to a modified example of the first example of the driving circuit 10. Components in FIG. 4 that are the same as those in FIG. 2 are denoted by the same reference symbols and their further explanation is omitted. In the circuit configuration of FIG. 4, the driving circuit 10 further includes a constant current source $I_{BIAS}$ as a third current supply circuit. One end of the constant current source $I_{BIAS}$ is connected to the constant voltage source VDD, and its other end is connected to the anode of the laser diode LD. The constant current source $I_{BIAS}$ supplies a preliminary current to the light emitting element 50, regardless of the level of the data signal. Thus, before the supply of the driving current with the first current supply circuit 30 starts, the laser diode LD is pre-charged, and, as shown in FIG. 3, the rise time can be further shortened than with the circuit configuration in FIG. 2. Moreover, since it is sufficient that the second current supply circuit 40 supplies the supplementary current from a state in which the light emitting element 50 is pre-charged, the size of the NMOS transistor M5 can be made smaller than in the circuit configuration in FIG. 2, and a configuration is possible in which also the driving capability of the inverter INV3 is smaller.

Figure 5:
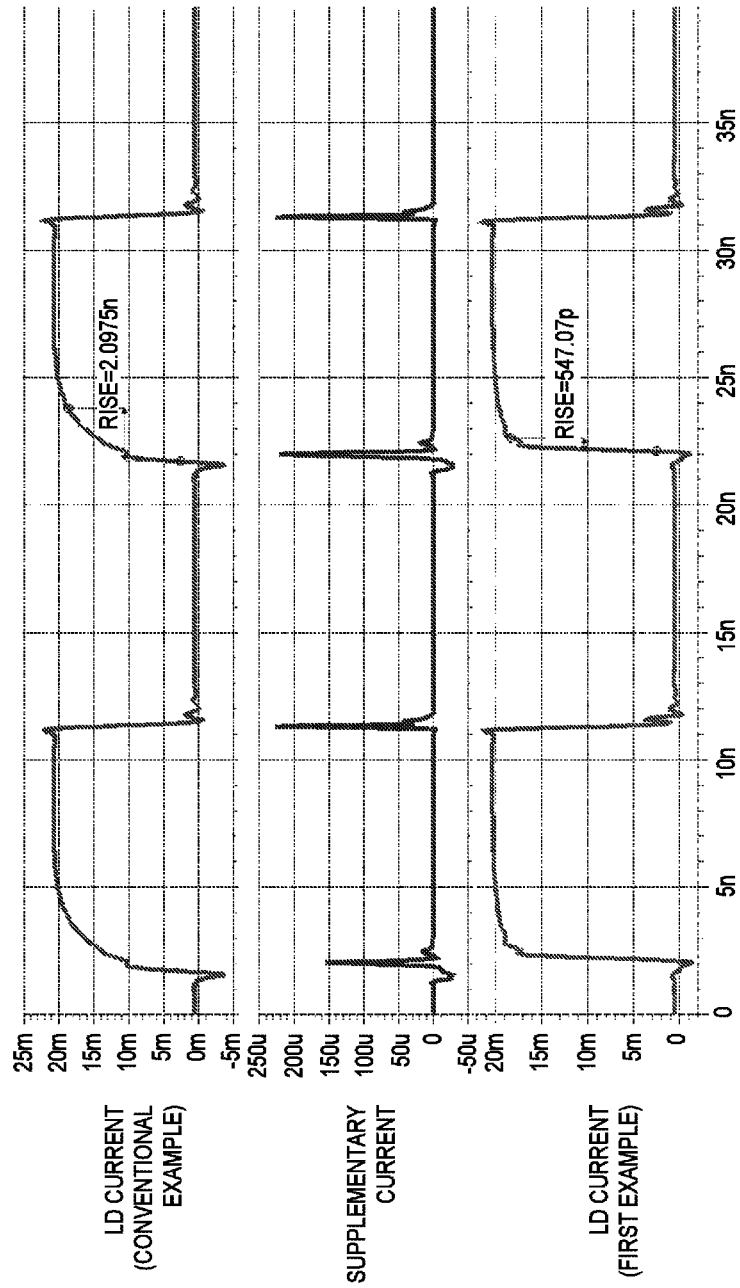
FIG. 5 is a diagram illustrating how the rise time is shortened by the circuit configuration of the present invention.

FIG. 5 is a drawing illustrating the shortening of the rise time with the circuit configuration in FIG. 4. In the graphs in FIG. 5, the horizontal axis denotes the time (in seconds) and the vertical axis denotes the current value (in Ampere). The graph at the top in FIG. 5 is a plot of simulated values of the current flowing through the laser diode LD in a conventional circuit configuration. The graph in the middle of FIG. 5 is a plot of the simulated values of the supplementary current with the circuit configuration of FIG. 4. The graph at the bottom of FIG. 5 is a plot of the simulated value of the current flowing through the laser diode LD with the circuit configuration of FIG. 4. As can be seen, with the circuit configuration in FIG. 4, the rise time, which is at least 2 ns in the conventional circuit configuration, can be shortened to 1 ns.

Figure 6:
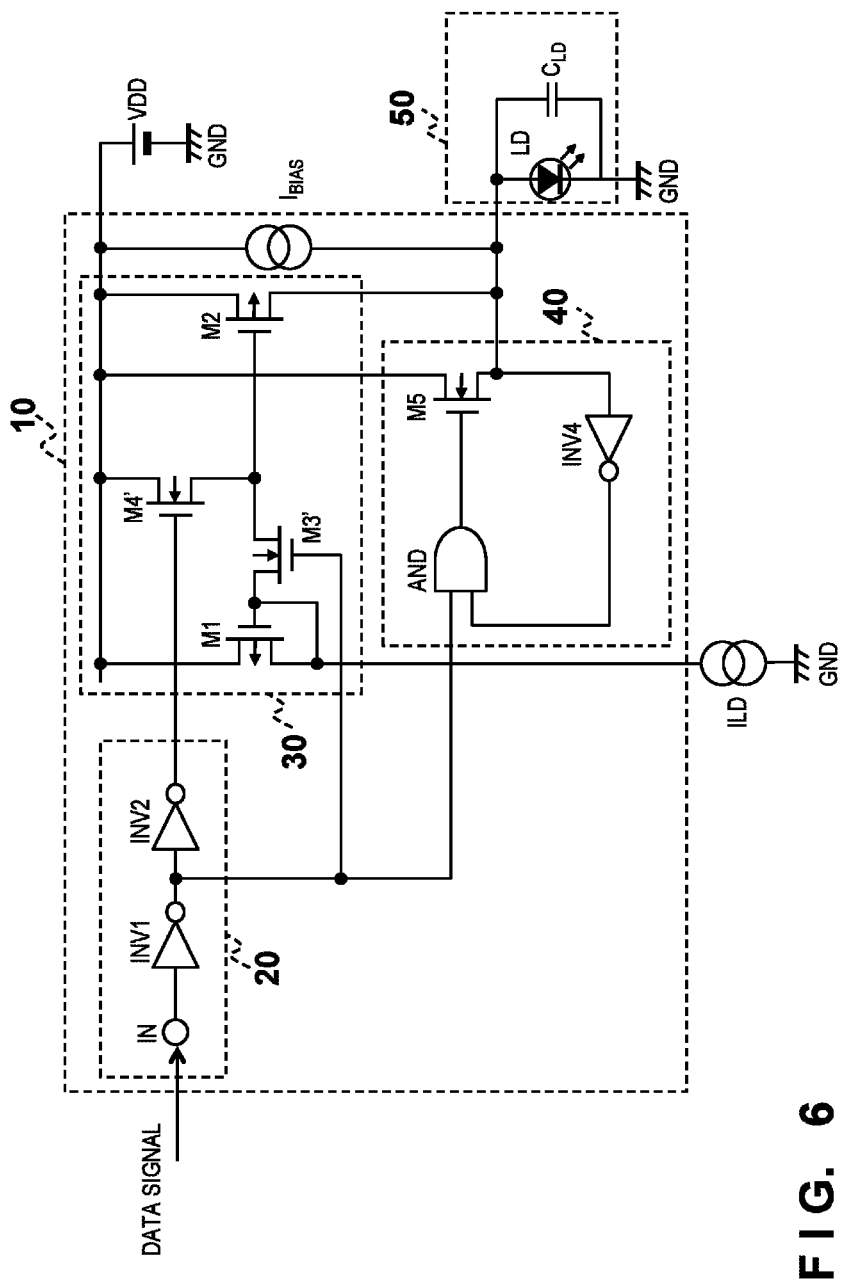
FIG. 6 is a diagram illustrating a circuit configuration of a driving circuit according to a second example of the present invention.

A circuit configuration according to a second example of the driving circuit 10 is explained with reference to FIG. 6. The main difference between the circuit configuration in FIG. 6 and the circuit configuration in FIG. 4 is the configuration of the second current supply circuit 40. The second current supply circuit 40 of the second example may include an NMOS transistor M5, an AND gate AND and an inverter INV 4. The drain of the NMOS transistor M5 is connected to the constant voltage source VDD, and the source of the NMOS transistor M5 is connected to the anode of the laser diode LD. The input terminal of the inverter INV4 is connected to the source of the NMOS transistor M5, and the output terminal of the inverter INV4 is connected to the first input terminal of the AND gate AND. The second input terminal of the AND gate AND is connected to the output terminal of the inverter INV1. The output terminal of the AND gate AND is connected to the gate of the NMOS transistor M5. In the circuit configuration of the second example, it is also possible to adopt a configuration in which no constant current circuit $I_{BIAS}$ is arranged, as in the circuit configuration in FIG. 2.

Figure 2:
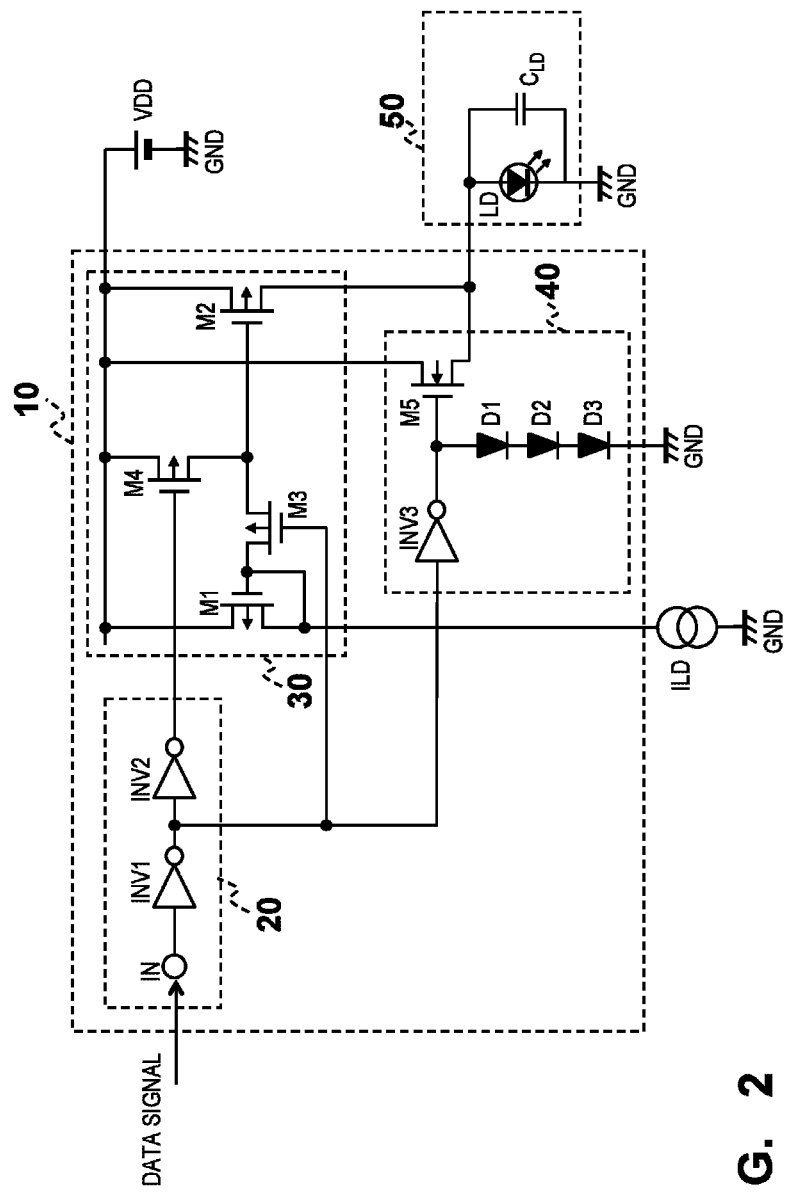
FIG. 2 is a diagram illustrating the circuit configuration of a driving circuit according to a first example of the present invention.

In the circuit configurations in FIGS. 2 and 4, while the data signal is at H level, current continues to flow through the inverter INV3 and the diodes D1 to D3. The value of this current is determined by the size of the PMOS transistor within the inverter INV3, and according to a simulation is about 100 μA. The second current supply circuit 40 consumes energy due to this current. In the second example, a configuration is adopted in which no such current flows, so that energy can be saved.

The following is an explanation of the operation of the driving circuit 10 according to the second example. In this example, different from the first example, the driving circuit 10 turns on the light emitting element 50 when the data signal is at L level and turns off the light emitting element 50 when the data signal is at H level. That is to say, a data signal that is L level serves as the driving signal for causing the light emitting element 50 to emit light. Therefore, NMOS transistors M3' and M4' are used instead of the PMOS transistors M3 and M4 in the first current supply circuit 30. The operation of the first current supply circuit 30 is similar to that of the first example, so that further explanations thereof are omitted. The following explanations focus on the operation of the second current supply circuit 40.

When the input terminal IN goes to L level, the potential of the second input terminal of the AND gate AND goes to H level. The potential of the input terminal of the inverter INV4 is the same as the potential of the anode of the laser diode LD, and immediately after the data signal changes to L level, it is approximately the potential of the pre-charged cathode (referred to below as "pre-charged potential"). The inverter INV4 regards the pre-charged potential at the input terminal as the L level, and outputs an H level signal. As a result, also the potential of the first input terminal of the AND gate AND goes to H level, and the AND gate AND outputs an H level signal. Thus, the NMOS transistor M5 starts to operate as a source follower, and to supply the supplementary current from the second current supply circuit 40 to the anode of the laser diode LD. When the potential of the anode of the laser diode LD increases and the voltage applied to the laser diode LD reaches the threshold voltage, then also the potential of the input terminal of the inverter INV4 reaches the threshold voltage of the inverter INV4. As a result, the output of the inverter INV4 changes to the L level, and the output of the AND circuit AND changes to the L level. Thus, the NMOS transistor M5 stops to operate as a source follower, and the supply of the supplementary current from the second current supply circuit 40 to the light emitting element 50 is stopped. The threshold voltage of the inverter INV4 may be set to the light emitting voltage of the laser diode LD or less. Thus, the supplementary current is supplied only at the start-up of the laser diode LD. In the second example, the inverter INV4 functions as a detection circuit that detects that the voltage applied to the laser diode LD has reached a threshold voltage.

On the other hand, when the input terminal IN goes to H level, the potential of the second input terminal of the AND circuit AND goes to L level, and the AND circuit AND outputs an L level signal. Therefore, the second current supply circuit 40 sustains a state in which the supply of the supplementary current to the light emitting element 50 is stopped. In FIG. 6, a configuration is shown in which the output of the inverter INV1 and the output of the inverter INV4 are provided to the AND gate AND. However, a configuration is also possible in which, instead of the output of the inverter INV1, the output of the inverter INV2 is provided to the AND gate AND. In this case, the NMOS transistors M3' and M4' are replaced by PMOS transistors M3 and M4. With this configuration, the laser diode LD emits light in synchronization with the H level data signal, as in the first example.

Figure 7:
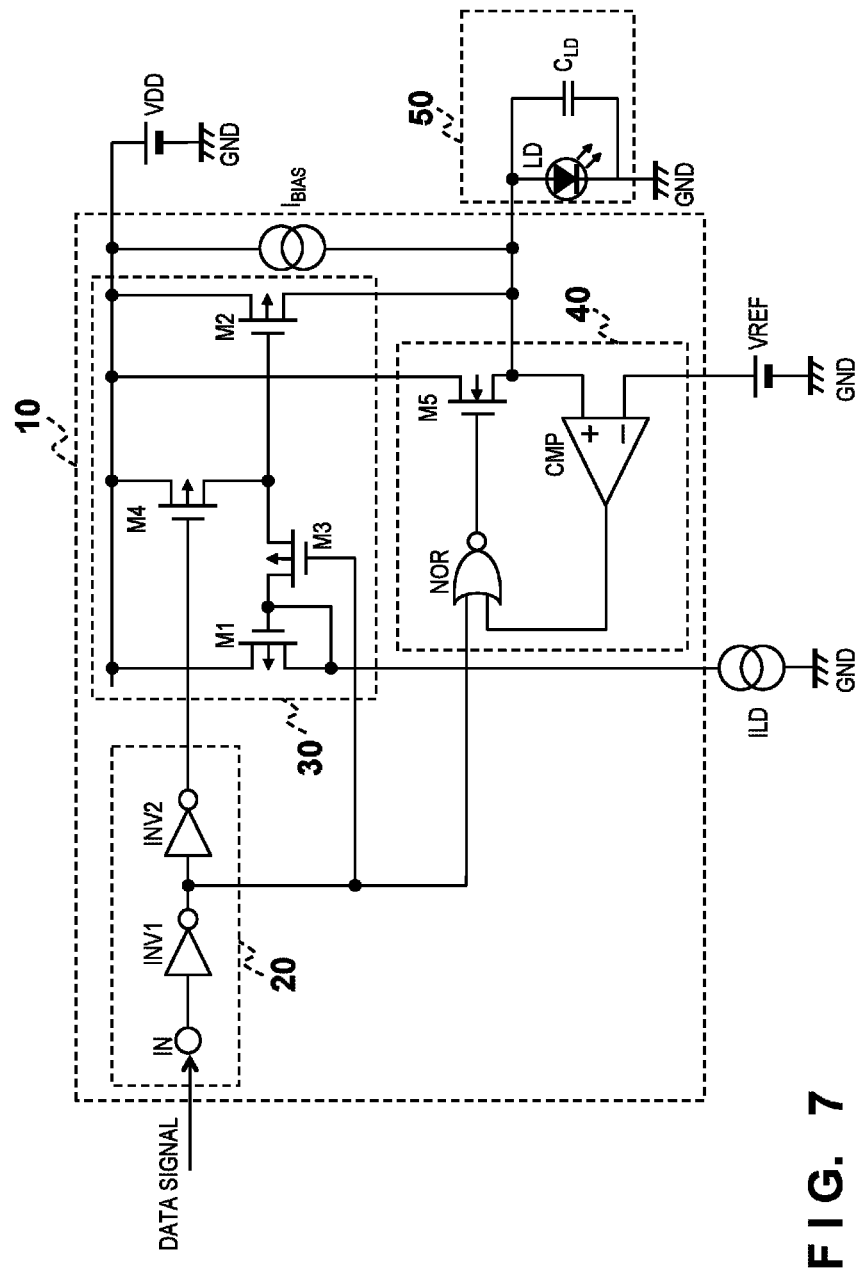
FIG. 7 is a diagram illustrating a circuit configuration of a driving circuit according to a third example of the present invention.

Referring to FIG. 7, the following is an explanation of a circuit configuration according to a third example of the driving circuit 10. The circuit configuration in FIG. 7 differs from the circuit configuration in FIG. 4 mainly with regard to the configuration of the second current supply circuit 40. The second current supply circuit 40 of the third example may include an NMOS transistor M5, a NOR gate NOR and a comparator CMP. The drain of the NMOS transistor M5 is connected to the constant voltage source VDD, and the source of the NMOS transistor M5 is connected to the anode of the laser diode LD. The first input terminal (positive input terminal) of the comparator CMP is connected to the source of the NMOS transistor M5, and the second input terminal (negative input terminal) of the comparator CMP is connected via a constant voltage source VREF to ground GND. The output terminal of the comparator CMP is connected to the first input terminal of the NOR gate NOR. The second input terminal of the NOR gate NOR is connected to the output terminal of the inverter INV1. The output terminal of the NOR gate NOR is connected to the gate of the NMOS transistor M5. In the circuit configuration of the third example, it is also possible to adopt a configuration in which no constant current circuit $I_{BIAS}$ is arranged, as in the circuit configuration in FIG. 2. Also with the configuration of FIG. 7, a lower power consumption can be realized, as in the configuration of FIG. 6.

The following is an explanation of the operation of the driving circuit 10 according to the third example. In this example, as in the first example, the driving circuit 10 turns on the light emitting element 50 when the data signal is at H level and turns off the light emitting element 50 when the data signal is at L level. That is to say, a data signal that is H level serves as the driving signal for causing the light emitting element 50 to emit light. The operation of the first current supply circuit 30 is similar to that of the first example, so that further explanations thereof are omitted. The following explanations focus on the operation of the second current supply circuit 40.

When the input terminal IN changes to H level, the potential of the second input terminal of the NOR gate NOR goes to L level. The potential of the first input terminal of the comparator CMP is the same as the potential of the anode of the laser diode LD, and immediately after the data signal changes to L level, it is approximately at the pre-charged potential. The reference voltage that is applied from the constant voltage source VREF to the second input terminal of the comparator CMP is set to be higher than the pre-charged potential, so that the comparator CMP outputs an L level signal. As a result, also the potential of the first input terminal of the NOR gate NOR goes to the L level, and the NOR gate NOR outputs an H level signal. Thus, the NMOS transistor M5 starts to operate as a source follower, and to supply the supplementary current from the second currents supply circuit 40 to the anode of the laser diode LD. When the potential of the anode of the laser diode LD increases and the voltage applied to the laser diode LD reaches the threshold voltage, the voltage applied to the first input terminal of the comparator CMP reaches the reference voltage. As a result, the output of the comparator CMP changes to the H level, and the output of the NOR gate NOR goes to L level. Thus, the NMOS transistor M5 stops to operate as a source follower, and the supply of the supplementary current from the second current supply circuit 40 to the light emitting element 50 stops. The reference voltage that is supplied to the constant voltage source VREF may be set to the light emitting voltage of the laser diode LD or less. Thus, the supplementary current is supplied only at the rise of the current through the laser diode LD. In the third example, the comparator CMP functions as a detection circuit that detects that the voltage applied to the laser diode LD has reached the threshold voltage.

On the other hand, when the input terminal IN goes to L level, the potential of the second input terminal of the NOR gate NOR goes to H level, and the NOR gate NOR outputs an L level signal. Therefore, the second current supply circuit 40 sustains a state in which the supply of the supplementary current to the light emitting element 50 is stopped.

In the foregoing examples, a laser diode of the cathode-common type was used as an example, but it is also possible to use a laser diode of the anode-common type. Moreover, in the foregoing examples, the path from the constant voltage source VDD through the PMOS transistor M2 constituting a portion of the current mirror circuit and the laser diode LD to ground GND does not include a constant current source. Thus, it is possible to drive the driving circuit with a lower voltage than in the case of a circuit configuration in which a constant current source is provided in this path, and the manufacturing costs of the system can be lowered.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-100131, filed Apr. 27, 2011, which is hereby incorporated by reference herein in its entirety.

What is claimed is:

1. A driving circuit for causing a light emitting element to emit light in response to a driving signal, the driving circuit comprising:
a first current supply circuit that starts to supply a first current for driving the light emitting element to the light emitting element in response to the driving signal; and
a second current supply circuit that starts to supply a second current to the light emitting element in response to the driving signal, the second current increasing a current supplied to the light emitting element, the second current supply circuit comprising a MOS transistor having a source connected to the light emitting element,
wherein the second current supply circuit stops supplying the second current in response to the MOS transistor being OFF,
wherein the first current supply circuit continues to supply the first current to the light emitting element after the second current supply circuit stops supplying the second current,
wherein the source of the MOS transistor is connected to the light emitting element without another transistor intervening therebetween,
wherein a constant voltage is applied to a drain of the MOS transistor,
wherein the second current supply circuit further comprises a diode fixing a potential of a gate of the MOS transistor in response to the driving signal, and
wherein the second current supply circuit stops supplying the second current as the MOS transistor stops operating as a source follower when a voltage applied to the light emitting element reaches a threshold voltage.

2. The driving circuit according to claim 1, wherein the threshold voltage is not greater than a light emission voltage of the light emitting element.

3. The driving circuit according to claim 1, wherein:
the first current supply circuit comprises a current mirror circuit that supplies to the light emitting element, as the first current, a current that depends on a current supplied from a constant current source; and
the current mirror circuit takes on an operative state in response to the driving signal.

4. The driving circuit according to claim 3, wherein the current mirror circuit comprises a first MOS transistor and a second MOS transistor,
wherein a first main electrode of the first MOS transistor and a first main electrode of the second MOS transistor are connected to a constant voltage source,
wherein a second main electrode of the first MOS transistor is connected to the constant current source, and
wherein a second main electrode of the second MOS transistor is connected to the light emitting element.

5. The driving circuit according to claim 1, further comprising:
a third current supply circuit that supplies a third current to the light emitting element prior to starting supply of the first current.

6. The driving circuit according to claim 1,
wherein the first current supply circuit comprises a first MOS transistor connected to the light emitting element, and
wherein the first current is supplied to the light emitting element from the first MOS transistor.

7. The driving circuit according to claim 6,
wherein the first MOS transistor is connected to the light emitting element without another transistor intervening therebetween.

8. The driving circuit according to claim 1, wherein a signal based on the driving signal is supplied to each of the first current supply circuit and the second current supply circuit through their respective signal paths.

9. The driving circuit according to claim 1, wherein a signal based on the driving signal and supplied to the first current supply circuit and a signal based on the driving signal and supplied to the second current supply circuit are complementary to each other.

10. A driving circuit for causing a light emitting element to emit light in response to a driving signal, the driving circuit comprising:
a first current supply circuit that starts to supply a first current for driving the light emitting element to the light emitting element in response to the driving signal; and
a second current supply circuit that starts to supply a second current to the light emitting element in response to the driving signal, the second current increasing a current to be supplied to the light emitting element, the second current supply circuit comprising a MOS transistor having a source connected to the light emitting element,
wherein the second current supply circuit stops supplying the second current in response to the MOS transistor being OFF,
wherein the first current supply circuit continues to supply the first current to the light emitting element after the second current supply circuit stops supplying the second current,
wherein a constant voltage is applied to the drain of the MOS transistor,
wherein the second current supply circuit further comprises an inverter whose input terminal is connected to the light emitting element,
wherein the inverter changes the level of a signal output therefrom when a voltage applied to the light emitting element has reached a threshold voltage, and
wherein the second current supply circuit stops supplying the second current as a potential of a gate of the MOS transistor changes in accordance with the output of the inverter.

11. The driving circuit according to claim 10, wherein the second current supply circuit stops supplying the second current in response to the voltage applied to the light emitting element reaching a voltage that is not greater than a light emission voltage of the light emitting element.

12. The driving circuit according to claim 10,
wherein the first current supply circuit comprises a current mirror circuit that supplies to the light emitting element, as the first current, a current that depends on a current supplied from a constant current source, and
wherein the current mirror circuit takes on an operative state in response to the driving signal.

13. The driving circuit according to claim 10, further comprising:
a third current supply circuit that supplies a third current to the light emitting element prior to starting supply of the first current.

14. The driving circuit according to claim 10, wherein a signal based on the driving signal is supplied to each of the first current supply circuit and the second current supply circuit through their respective signal paths.

15. The driving circuit according to claim 10, wherein a signal based on the driving signal and supplied to the first current supply circuit and a signal based on the driving signal and supplied to the second current supply circuit are complementary to each other.

16. A driving circuit for causing a light emitting element to emit light in response to a driving signal, the driving circuit comprising:
a first current supply circuit that starts to supply a first current for driving the light emitting element to the light emitting element in response to the driving signal; and
a second current supply circuit that starts to supply a second current to the light emitting element in response to the driving signal, the second current increasing a current supplied to the light emitting element, the second current supply circuit comprising a MOS transistor having a source connected to the light emitting element,
wherein the second current supply circuit stops supplying the second current in response to the MOS transistor being OFF,
wherein the first current supply circuit continues to supply the first current to the light emitting element after the second current supply circuit stops supplying the second current,
wherein a constant voltage is applied to the drain of the MOS transistor,
wherein the second current supply circuit further comprises a comparator whose first input terminal is connected to the light emitting element, and a reference voltage is applied to a second input terminal of the comparator, wherein the comparator changes the level of a signal output therefrom when a voltage applied to the light emitting element has reached a threshold voltage, and wherein the second current supply circuit stops supplying the second current as the potential of a gate of the MOS transistor changes in accordance with the output of the comparator.

17. The driving circuit according to claim 16, wherein the second current supply circuit stops supplying the second current in response to the voltage applied to the light emitting element reaching a voltage that is not greater than a light emission voltage of the light emitting element.

18. The driving circuit according to claim 16, wherein the first current supply circuit comprises a current mirror circuit that supplies to the light emitting element, as the first current, a current that depends on a current supplied from a constant current source, and wherein the current mirror circuit takes on an operative state in response to the driving signal.

19. The driving circuit according to claim 16, further comprising:

a third current supply circuit that supplies a third current to the light emitting element prior to starting supply of the first current.

20. The driving circuit according to claim 16, wherein a signal based on the driving signal is supplied to each of the first current supply circuit and the second current supply circuit through their respective signal paths.

* * * * *